United States Patent [19]

Gibson, Jr.

[11] Patent Number: 6,017,147
[45] Date of Patent: Jan. 25, 2000

[54] CALORIMETRIC WATTMETER FOR TESTING MICROWAVE OVENS

[76] Inventor: Oliver E. Gibson, Jr., 1430 Solomon Rd., Santa Maria, Calif. 93455

[21] Appl. No.: 09/040,766

[22] Filed: Mar. 18, 1998

Related U.S. Application Data

[63] Continuation-in-part of application No. 08/584,318, Jan. 16, 1996, Pat. No. 5,749,654.

[51] Int. Cl.$^7$ .................................................. G01K 17/00
[52] U.S. Cl. .............................................. 374/32; 324/95
[58] Field of Search ........................ 374/32, 141; 324/95

[56] References Cited

U.S. PATENT DOCUMENTS

| | | | |
|---|---|---|---|
| D. 391,502 | 3/1998 | Moerman | D10/75 |
| 612,518 | 10/1898 | Herbener | 374/198 |
| 2,261,826 | 11/1941 | Brown | 374/198 |
| 2,408,198 | 9/1946 | Coltman | 324/95 |
| 2,451,724 | 10/1948 | Evans | 324/95 |
| 2,648,047 | 8/1953 | Hollingsworth | 324/95 |
| 2,846,647 | 8/1958 | MacPherson | 324/95 |
| 2,848,683 | 8/1958 | Jones | 324/92 |
| 2,866,950 | 12/1958 | Smits | 333/22 |
| 3,040,252 | 6/1962 | Novak | 324/95 |
| 3,670,570 | 6/1972 | Briones | 73/190 R |
| 3,748,424 | 7/1973 | Fitzmayer | 219/10.55 |
| 4,529,855 | 7/1985 | Fleck | 219/10.55 D |
| 4,656,325 | 4/1987 | Keefer | 219/10.55 E |
| 4,740,763 | 4/1988 | Wilhelm et al. | 374/32 |
| 4,916,386 | 4/1990 | Schultz | 324/95 |
| 4,968,150 | 11/1990 | Mathews et al. | 374/32 |
| 5,015,943 | 5/1991 | Mako et al. | 374/32 |
| 5,749,654 | 5/1998 | Gibson, Jr. | 374/32 |
| 5,779,362 | 7/1998 | Lightfoot | 374/32 |

FOREIGN PATENT DOCUMENTS

| | | | |
|---|---|---|---|
| 0495599 | 7/1992 | European Pat. Off. | 374/32 |
| 0362248 | 2/1973 | U.S.S.R. | 374/32 |
| 1109663 | 8/1984 | U.S.S.R. | 374/32 |
| 1009163 | 11/1965 | United Kingdom | 374/32 |

OTHER PUBLICATIONS

Scott, B., "Laser Energy Measurements With a Liquid Absorption Cell," J. Sci. Instrum., vol. 43, pp. 940–942 (1966).

Wharton, C., "Calorimetric Measurements of Single Pulse High–Power Microwaves in Oversized Waveguides," Dev. Sci. Instrum., vol. 57, No. 5, pp. 855–858 (May 1986).

Clogston, Abstract of Serial No. 608291, Filed Aug. 1, 1945, Published in O.G. on Sep. 12, 1950.

Meahl, Abstract of Serial No. 706894, Filed Oct. 31, 1946, Published in O.G. on Sep. 26, 1950.

*Primary Examiner*—Diego Gutierrez
*Assistant Examiner*—G. Verbitsky
*Attorney, Agent, or Firm*—Stetina Brunda Garred & Brucker

[57] ABSTRACT

A calorimetric wattmeter for testing a microwave oven. The wattmeter comprises a housing which defines an interior chamber for holding a quantity of a microwave absorbing liquid. Attached to the housing is a thermometer having a sensor portion which extends into the interior chamber and an indicator portion which moves in response to temperature changes sensed by the sensor portion. Additionally, rotatably attached to the housing is a scale which circumvents the indicator portion and includes indicia thereon for correlating the position of the indicator portion to a microwave oven wattage reading. The scale is selectively rotatable for purposes of resetting the microwave oven wattage reading to zero relative to the position of the indicator portion. The housing also includes a pair of neon gas filled enclosures attached thereto for providing a visual indication of the presence of microwaves.

3 Claims, 3 Drawing Sheets

CALORIMETRIC WATTMETER FOR TESTING MICROWAVE OVENS

RELATED APPLICATION

The present application is a continuation-in-part of U.S. application Ser. No. 08/584,318 entitled CALORIMETRIC WATTMETER FOR TESTING MICROWAVE OVENS filed Jan. 16, 1996, now U.S. Pat. No. 5,749,654 the disclosure of which is incorporated herein by reference.

FIELD OF THE INVENTION

The present invention relates generally to microwave powered measurement devices, and more particularly to a calorimetric instrument for determining the microwave power generated by a microwave oven.

BACKGROUND OF THE INVENTION

There is currently known in the prior art a calorimetric method of measuring microwave power. Such method comprises the steps of permitting microwaves to be absorbed by a suitable medium, such as a measured quantity of water, measuring the temperature rise in the medium, and relating the temperature rise to the microwave power. In this respect, in the calorimetric method, the temperature rise in the absorption medium is proportional to the microwave power. Though currently known microwave ovens are typically adapted to generate microwave power levels that are nominally in the range of 400 to 1500 watts, the actual power generated may be less than the nominal or rated power due to the deterioration of the components of the microwave oven over time. As such, techniques for measuring microwave power are important for determining whether the microwave oven is operating at its rated output, which is often a matter of serious concern to large restaurant chains and to home cooks.

As indicated above, the technique of using a calorimeter to measure microwave power is known in the prior art, and is described in U.S. Pat. No. 2,648,047 (Hollingsworth), U.S. Pat. No. 2,846,647 (MacPherson), U.S. Pat. No. 2,848,683 (Jones), and U.S. Pat. No. 2,866,950 (Smits). Though these particular references are directed to the use of a calorimeter to measure microwave power, they do not teach or suggest an instrument that would be practical for use in testing microwave ovens.

Though there is known in the prior art wattage detectors for use in relation to microwave ovens, such prior art detectors possess certain deficiencies which detract from their overall utility. One such prior art microwave oven wattage detector is the calorimeter disclosed in U.S. Pat No. 4,916,386 (Schultz). The Schultz reference describes a calorimeter comprising a container which holds a quantity of fluid. Immersed in the fluid is a liquid crystal thermometer. This thermometer is itself subject to inaccuracies due in part to its digital nature, and in part to the difficulty in determining which of its elements is the most brightly illuminated.

The calorimeter disclosed in the Schultz reference is used by operating the microwave oven for a pre-determined length of time while the calorimeter is disposed therein. As is well known in the prior art, microwave ovens include a timer into which the user sets the desired cooking time and which limits the cooking time to the duration set into the timer. When a calorimeter is used to check the operation of the microwave oven, as in the Schultz reference, the duration of oven operation is set in the above-described manner.

However, this particular method of determining the duration of time over which full microwave power is applied to the absorption medium of the calorimeter is subject to an inaccuracy. In this respect, as is acknowledged in the Schultz reference, there is typically a delay, on the order of several seconds, between the time when the START button of a microwave oven is pushed, and the time when the microwave magnetron generator of the microwave oven fires, thus producing the full microwave power. Though the Schultz reference characterizes such delays as being minor, measuring times on the order of 30 seconds are taught thereby. Clearly, as the on time of the microwave oven is decreased, this source of error becomes more significant. Indeed, as will be discussed in more detail below, in the calorimetric wattmeter constructed in accordance with the present invention, oven on times on the order of 10 seconds are contemplated, thus causing a time delay of several seconds between the nominal time interval and the actual time interval to become much more significant.

Another source of measurement error encountered in the use of prior art microwave oven wattage detectors arises from variations in the initial temperature of the absorption medium to be heated. In the calorimetric wattmeter constructed in accordance with the present invention, it is contemplated that the user will fill the same with tap water immediately prior to making a measurement of microwave power within the microwave oven. As will be recognized, the temperature of the tap water may vary considerably from one measurement to another. To solve this temperature variance problem, the Schultz reference teaches placing the calorimeter disclosed therein into a refrigerator prior to its use, then bringing the calorimeter out of the refrigerator and allowing the temperature thereof to rise to a certain specific temperature at which the measurement of the microwave power is initiated. Though this technique results in a constant starting temperature, it requires the extra step of chilling the absorption medium.

In summary, prior art calorimeters for use in measuring microwave oven wattage suffer from two primary disadvantages. Firstly, an initial chill-down or cooling process within a refrigerator is needed to assure that the calorimeter has a constant starting temperature at the initiation of each microwave power measurement. Secondly, the measurement process must be conducted for time periods on the order of thirty seconds so as to minimize the error caused by the delayed start-up of the microwave magnetron generator. The present invention addresses and overcomes the above-described deficiencies of the prior art microwave oven wattage detectors by providing an improved calorimetric wattmeter that does not require chilling in a refrigerator prior to being used to obtain a microwave power measurement, requires microwave oven on times as short as 10 seconds to obtain a microwave power measurement, and eliminates the error caused by the delayed firing of the microwave magnetron generator of the microwave oven.

Regarding one additional aspect of the calorimetric wattmeter of the present invention, it should be noted that the use of a neon bulb or lamp as an indicator of the presence of microwave radiation is known in the prior art, and is described in U.S. Pat, No. 3,748,424 (Fitzmayer), U.S. Pat. No. 4,529,855 (Fleck), and U.S. Pat. No. 2,408,198 (Coltman).

SUMMARY OF THE INVENTION

In accordance with the present invention, there is provided a calorimetric wattmeter for testing the wattage output of a microwave oven. The wattmeter comprises a housing which defines an interior chamber for holding a quantity of a microwave absorption medium. In the present invention, it is contemplated that such microwave absorption medium will comprise tap water. However, those of ordinary skill in the art will recognize that other liquids which are capable of absorbing microwave radiation may be employed in the present wattmeter. In the preferred embodiment, the interior chamber of the housing is sized to hold a quantity or volume of approximately 6 cubic inches of the water or other microwave absorbing liquid. The infusion of the water into the interior chamber is preferably accomplished through the use of an opening disposed within the housing. The infusion opening is preferably provided at a location within the housing wherein any volume of water in excess of approximately 6 cubic inches is caused to spill out from within the interior chamber.

In addition to the infusion opening, the housing preferably includes at least one venting aperture disposed therein which communicates with the interior chamber. The venting aperture, along with the infusion opening, is used for the venting of expanding air from within the interior chamber as occurs when the present wattmeter is exposed to microwave radiation. The venting aperture and/or infusion opening also provides an outlet for any water vapor or steam produced as a result of the heating of the water which occurs when the same absorbs microwave radiation. The housing is preferably fabricated from nylon for purposes of withstanding elevated temperatures, though other suitable materials may be employed in relation thereto.

In addition to the housing, the present wattmeter comprises a thermometer which is attached to the housing and has a sensor portion which extends into the interior chamber. The thermometer also has an indicator portion which includes a pointer defining a tip. The indicator portion, and in particular its pointer, moves in response to changes in temperature sensed by the sensor portion of the thermometer. The thermometer is itself fabricated from a microwave compatible material.

Rotatably attached to the housing is a scale or wattage ring of the wattmeter which circumvents the indicator portion of the thermometer. The scale includes indicia thereon which is used to correlate the position of the tip of the pointer of the indicator portion to a particular microwave oven wattage reading. Advantageously, the scale is selectively rotatable for purposes of resetting the microwave oven wattage reading to zero relative to the position of the tip of the pointer of the indicator portion. The orientation of the indicia on the scale corresponds to the volume of water or other microwave absorbing liquid within the interior chamber of the housing and the measurement characteristics of the thermometer such that the microwave oven wattage reading is properly correlated to the change in temperature of the water attributable to its absorption of microwave radiation. In the present wattmeter, the housing, thermometer and scale collectively define a calorimeter thereof.

In addition to the foregoing, the present wattmeter includes at least one, and preferably a pair of enclosures which are attached to the housing. Each of the enclosures is preferably fabricated from a translucent material and is filled with a quantity of gas which illuminates when exposed to microwave radiation. In the preferred embodiment, each of the enclosures is filled with a quantity of neon gas. The translucent material preferably used to fabricate the enclosures allows for easy visual observation of the illumination of the neon gas which evidences the presence of microwave radiation within the cooking chamber of the microwave oven into which the present wattmeter is placed. Since most microwave ovens are provided with a rotatable antenna/stirrer in the top and/or bottom of the microwave cavity for evenly dispersing or distributing microwaves therein, the rotation of the antenna(s)/stirrer(s) is evidenced by the illumination of the neon gas within the enclosures in a strobe-like manner.

Further in accordance with the present invention, there is provided a method for measuring the wattage output of a microwave oven having a cooking chamber, a timer into which a nominal radiation time may be set, a START button that activates the timer, and a microwave magnetron generator that supplies microwaves to the cooking chamber a number of seconds after the START button is pushed. The present method employs the use of a calorimetric wattmeter having a housing defining an interior chamber, a thermometer attached to the housing and including a sensor portion which extends into the interior chamber and an indicator portion which moves in response to temperature changes sensed by the sensor portion, a scale which includes wattage indicia and is rotatably attached to the housing in a manner circumventing the indicator portion, and at least one neon gas filled enclosure attached to the housing.

The present method comprises the initial step of filling the interior chamber of the housing with a quantity of a microwave absorbing liquid, and more particularly approximately 6 cubic inches of water. Thereafter, the scale is rotated to set the wattage indicia thereon to zero relative to the position of the indicator portion of the thermometer. The wattmeter is then placed into the cooking chamber of the microwave oven, with a specific nominal radiation time T1 then being set or input into the timer of the microwave oven. In the present method, a preferred specific nominal radiation time T1 of approximately 10 seconds is input into the timer.

After the timer of the microwave oven has been set, the START button thereof is pressed. The pressing of the START button is followed by counting the number of seconds T2 that elapse between when the START button is pushed and when the neon gas in the enclosure illuminates. A preliminary wattage reading is then obtained from the scale by correlating the position of the indicator portion to the wattage indicia on the scale. Finally, the wattage output of the microwave oven is determined by multiplying the preliminary wattage reading by the formula T1/(T1−T2).

BRIEF DESCRIPTION OF THE DRAWINGS

These, as well as other features of the present invention, will become more apparent upon reference to the drawings wherein.

DETAILED DESCRIPTION OF THE PREFERRED EMBODIMENT

Figure 1:
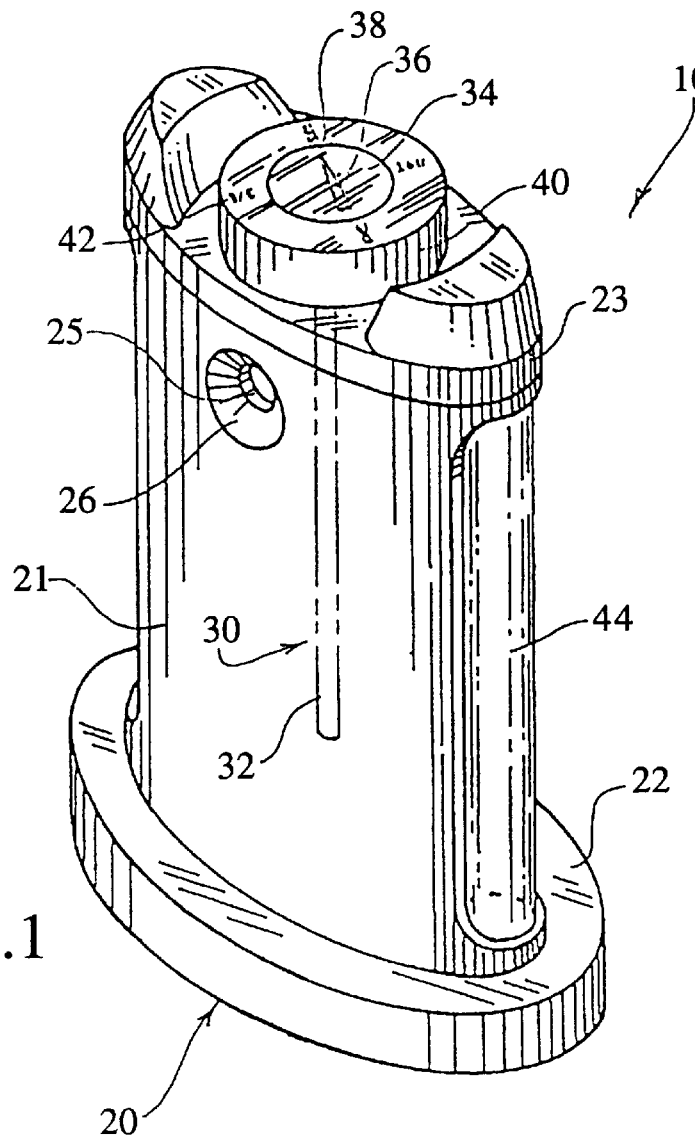
FIG. 1 is a front perspective view of the calorimetric wattmeter constructed in accordance with the present invention.
Figure 6:
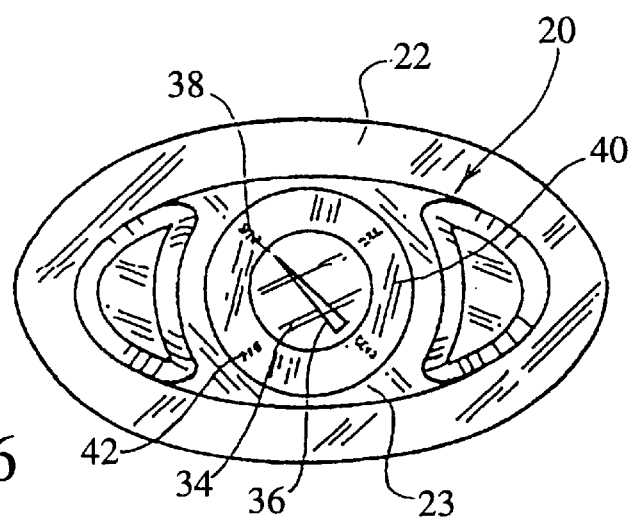
FIG. 6 is a top view of the calorimetric wattmeter of the present invention.
Figure 5:
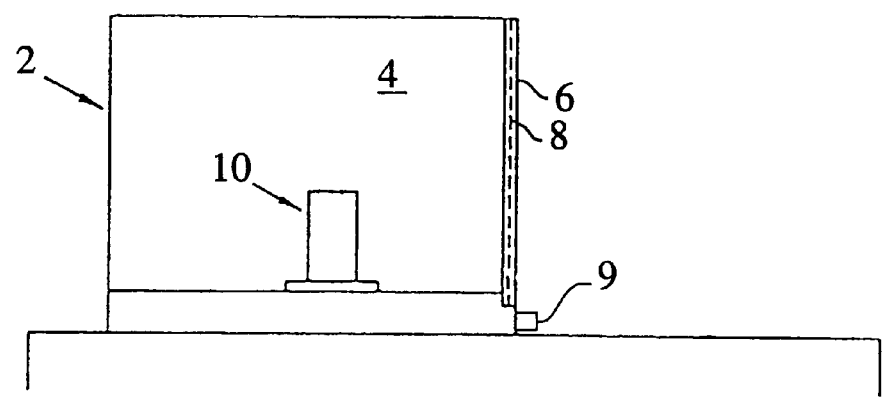
FIG. 5 is a side elevational view of a microwave oven in which the calorimetric wattmeter of the present invention may be used.

Referring now to the drawings wherein the showings are for purposes of illustrating a preferred embodiment of the present invention only, and not for purposes of limiting the same, FIG. 1 perspectively illustrates a calorimetric wattmeter 10 constructed in accordance with the present invention for use in testing the wattage output of a microwave oven 2 which is shown in FIG. 5. The microwave oven 2 is of a conventional design and includes a door 6 which is opened to permit access to a cooking chamber 4. The door 6 is provided with a perforated screen 8 through which food can be viewed while it is cooking within the cooking chamber 4. The perforations in the screen 8 are sized so as to prevent the passage of microwaves therethrough as would otherwise result in their escape from within the cooking chamber 4 of the microwave oven 2.

The microwave oven 2 further includes a timer into which the user sets a nominal desired cooking or radiation time T1. In addition to the timer, the microwave oven 2 is provided with a START button 9 which, when pressed by the user, applies electric power to the circuitry of the microwave oven 2. This circuitry typically includes a high voltage power supply having one or more capacitors, and a microwave magnetron generator which is electrically connected to the power supply and produces microwaves. When the capacitors have been charged to a certain voltage, the microwave magnetron generator is caused to initiate the production of microwaves. Typically, a number of seconds T2 elapse between the instant when the START button 9 is pushed and the instant when the microwave magnetron generator initiates the production of microwaves. Those of ordinary skill in the art will recognize that pressing the START button 9 is equivalent to actuating a START switch so as to apply electric power to the circuitry of the microwave oven 2 that facilitates the production of microwaves.

The wattmeter 10 itself comprises a housing 20 which has a generally oval-shaped cross-sectional configuration. The housing 20 includes a sidewall portion 21 having an enlarged base portion 22 formed on the bottom end thereof. The base portion 22 is adapted to be positioned upon a generally planar support surface for purposes of providing stability to the housing 20 and maintaining the same in a generally vertical or upright orientation. Attached to the top end of the sidewall portion 21 is a lid portion 23 of the housing 20. The housing 20 also includes an interior chamber 24 which is collectively defined by the sidewall, base and lid portions 21, 22, 23, and is used for holding a quantity of a microwave absorption medium. In the wattmeter 10, it is contemplated that such microwave absorption medium will comprise ordinary tap water. However, those of ordinary skill in the art will recognize that other liquids which are capable of absorbing microwave radiation may be employed in the wattmeter 10.

Figure 2:
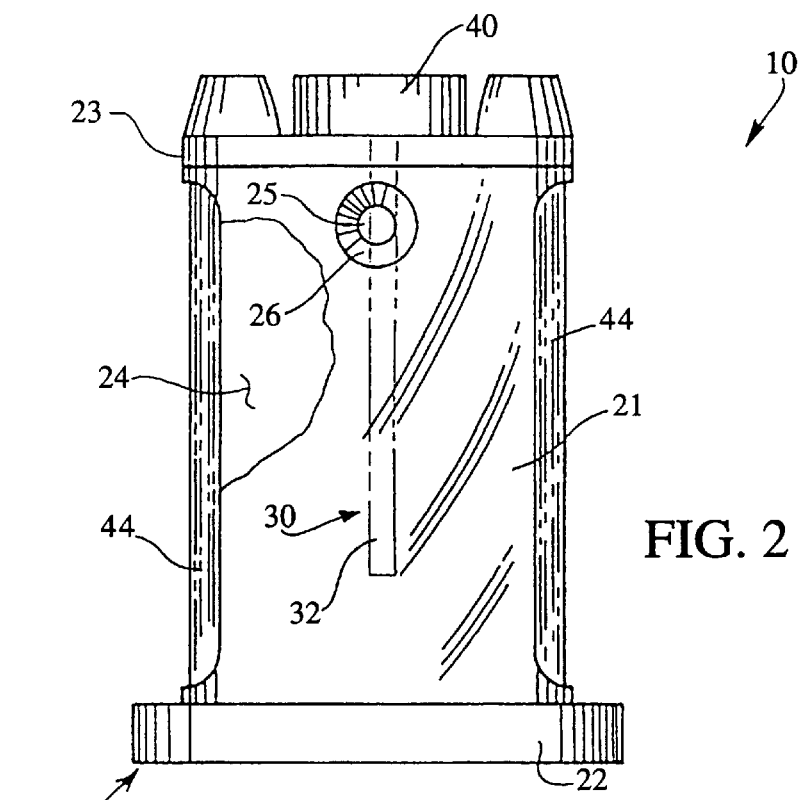
FIG. 2 is a front elevational view of the calorimetric wattmeter of the present invention.

In the preferred embodiment, the interior chamber 24 of the housing 20 is sized to hold a quantity or volume of approximately six cubic inches of the water or other microwave absorbing liquid. The infusion of the water into the interior chamber 24 is preferably accomplished through the use of an infusion opening 25 disposed within the sidewall portion 21 of the housing 20. As best seen in FIGS. 1 and 2, circumventing the infusion opening 25 is a beveled or tapered surface section 26 of the sidewall portion 21 which assists in channeling water into the interior chamber 24 of the housing 20 via the infusion opening 25. Importantly, the infusion opening 25 is preferably provided at a location within the sidewall portion 21 of the housing 20 wherein any volume of water in excess of approximately six cubic inches is caused to spill out from within the interior chamber 24 when the housing 20 is oriented in its upright position as shown in FIGS. 1–4.

Figure 3:
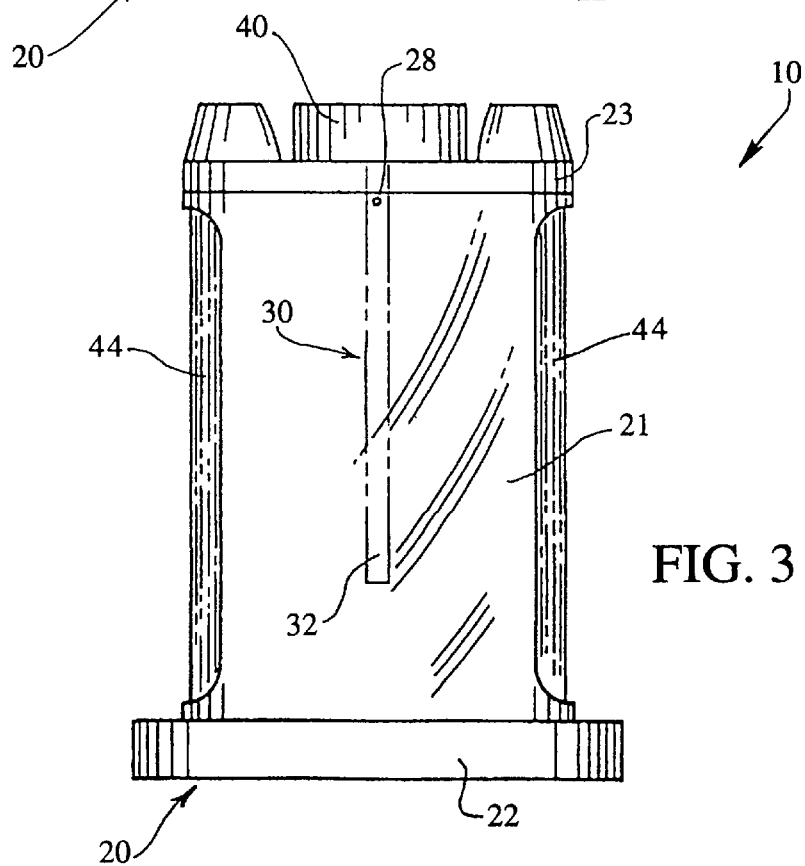
FIG. 3 is a rear elevational view of the calorimetric wattmeter of the present invention.
Figure 4:
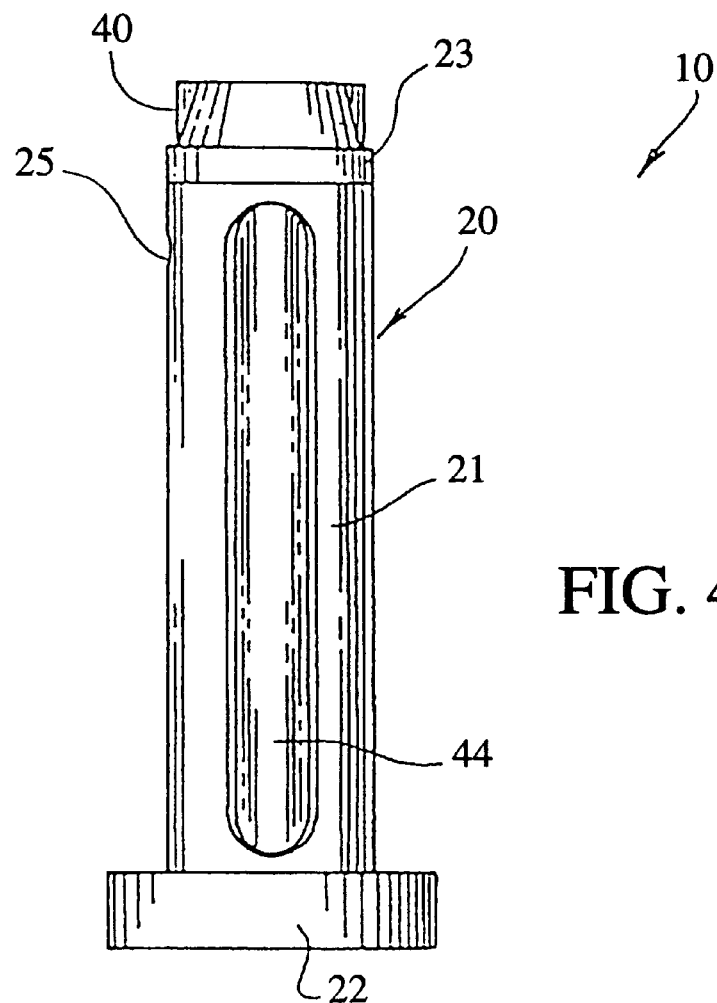
FIG. 4 is a side elevational view of the calorimetric wattmeter of the present invention.

As seen in FIG. 3, the housing 20 further preferably includes a venting aperture 28 which is disposed within the sidewall portion 21 thereof and communicates with the interior chamber 24. The venting aperture 28, along with the infusion opening 25, is used for the venting of expanding air from within the interior chamber 24 as occurs when the wattmeter 10 is exposed to microwave radiation. The venting aperture 28 and/or infusion opening 25 also provides an outlet for any water vapor or steam produced as a result of the heating of the water which occurs when the same absorbs microwave radiation. The housing 20 is preferably fabricated from a plastic material, such as nylon, that is relatively transparent to microwave radiation and is capable of withstanding elevated temperatures. Additionally, the housing 20 is preferably injection molded, though other fabrication techniques may also be employed in relation thereto.

In addition to the housing, the wattmeter 10 comprises a thermometer 30 which is attached to the housing 20, and more particularly to the lid portion 23 thereof. The thermometer 30 includes an elongate sensor portion 32 which, when the thermometer 30 is attached to the lid portion 23, extends into the interior chamber 24 of the housing 20. In addition to the sensor portion 32, the thermometer 30 has an indicator portion 34 which includes a rotatable pointer 36 defining a tip 38. The indicator portion 34, and in particular its pointer 36, moves in response to changes in temperature sensed by the sensor portion 32 of the thermometer 30. The thermometer 30 is itself fabricated from a microwave compatible material.

The wattmeter 10 of the present invention further comprises a circularly configured wattage ring or scale 40 which is rotatably attached to the lid portion 23 of the housing 20 and circumvents the indicator portion 34 of the thermometer 30. The scale 40 includes marks or indicia 42 thereon which read in watts and are used to correlate the position of the tip 38 of the pointer 36 to a particular microwave oven wattage reading. Advantageously, the scale 40 is selectively rotatable for purposes of re-setting the microwave oven wattage reading to zero relative to the position of the tip 38 of the pointer 36. The orientation of the indicia 42 on the scale 40 corresponds to the volume of water or other microwave absorbing liquid within the interior chamber 24 of the housing 20 and the measurement characteristics of the thermometer 30, such that the microwave oven wattage reading is properly correlated to the change in temperature of the water attributable to its absorption of microwave radiation. In the wattmeter 10, the housing 20, thermometer 30, and scale 40 collectively define a calorimeter thereof.

In addition to the above-described components, the wattmeter 10 includes a pair of enclosures 44 which are attached to and extend longitudinally along opposed sides of the sidewall portion 21 of the housing 20. Each of the enclosures 44 is preferably fabricated from a translucent material and is filled with a quantity of gas which illuminates or glows when exposed to microwave radiation. In the preferred embodiment, each of the enclosures 44 is filled with a quantity of neon gas. The translucent material preferably used to fabricate the enclosures 44 allows for easy visual observation of the illumination of the neon gas which evidences the presence of microwave radiation within the cooking chamber 4 of the microwave oven 2 into which the wattmeter 10 is placed, as will be discussed in more detail below. Since most microwave ovens are provided with a rotatable antenna/stirrer adjacent the top and/or bottom of the cooking chamber for evenly disbursing or distributing microwaves therein, the rotation of the antenna(s)/stirrer(s) is evidenced by the illumination of the neon gas within the enclosures 44 in a strobe-like manner.

All calorimeters have in common the use of an energy-absorbing medium and a temperature sensor for measuring the temperature rise in the energy-absorbing medium that results from the absorption of energy. In the wattmeter 10, a measured mass of water or other microwave absorbing liquid held within the interior chamber 24 is irradiated by microwaves in the microwave oven 2, with the thermometer 30 being used to measure the temperature rise that occurs in the water. In this respect, the wattmeter 10 works in accordance with the principle that when it is exposed to microwaves of a known intensity for a known actual time, a certain rise in temperature of the water occurs, thereby resulting in a certain movement of the pointer 36 of the indicator portion 34 of the thermometer 30. The temperature increase of the water attributable to its absorption of microwaves is generally proportional to the microwave intensity and to the actual duration of the radiation.

In using the present wattmeter 10, the initial temperature of the water within the interior chamber 24 is not important, since the key measurement parameter is the increase in temperature of the water resulting from its irradiation. The rotatability of the scale 40 relative to the indicator portion 34 of the thermometer 30 allows for the measurement process to be initiated with the indicia 42 being "zeroed".

The wattmeter 10 of the present invention is used by initially filling the interior chamber 24 of the housing 20 with water or other microwave absorbing liquid via the infusion opening 25. Thereafter, the scale 40 is rotated to set the wattage indicia 42 thereon to zero relative to the position of the tip 38 of the pointer 36. As will be recognized, after filling the interior chamber 24 with the water, ample time is afforded to allow the indicator portion 34 of the thermometer 30 to react to the temperature of the water sensed by the sensor portion 32 prior to zeroing the scale 40.

Subsequent to the scale 40 being zeroed in the above-described manner, the wattmeter 10 is placed into the cooking chamber 4 of the microwave oven 2. When the wattmeter 10 is placed into an upright position, water within the interior chamber 24 in excess of the desired volume of approximately six cubic inches overflows or spills from within the interior chamber 24 via the infusion opening 25, thus assuring that the same volume of water (i.e., approximately six cubic inches) is used in each measurement of microwave oven wattage.

After the wattmeter 10 has been placed into the cooking chamber 4 of the microwave oven 2 and the door 6 closed, a specific nominal radiation time T1 is then set or input into the timer of the microwave oven 2. In the present invention, a preferred specific nominal radiation time T1 of approximately 10 to 15 seconds, and most preferably about 10 seconds, is input into the timer. After the timer of the microwave oven 2 has been set, the START button 9 thereof is pressed, thus initiating the flow of electricity to the circuitry of the microwave oven 2. Upon pressing the START button 9, the user counts the number of seconds T2 that elapse between when the START button 9 is pushed and when the neon gas in the enclosures 44 is illuminated. Because the time delay T2 is used to calculate a correction to the nominal time T1, there is no need to determine the time delay T2 with great precision, with sufficient accuracy ordinarily being obtained by the user's estimate thereof. The presence of microwaves within the cooking chamber 4 is evidenced by the neon gas within the enclosures 44 emitting a characteristic red visible light. The enclosures 44 of the wattmeter 10 may be easily observed through the perforated screen 8 of the door 6. Ordinarily, the user of the wattmeter 10 will have no difficulty in determining the time delay T2 (i.e., counting the number of seconds that elapse) between when the START button 9 is pushed and when the neon gas within the enclosures 44 is illuminated by the microwaves within the cooking chamber 4. The time delay T2, though initially being unknown by the user, typically falls somewhere in the range of from zero to several seconds.

After the specific nominal radiation time T1 has elapsed, a preliminary wattage reading is obtained from the scale 40 of the wattmeter 10 by correlating the position of the tip 38 of the pointer 36 to the wattage indicia 42 on the scale 40. As will be recognized, greater oven wattage outputs will result in greater increases in temperature of the water within the interior chamber 24 during the nominal time T1, which will in turn result in greater movement of the pointer 36 of the indicator portion 34 and hence higher preliminary wattage readings based on the position of the tip 38 relative to the indicia 42 of the scale 40. After a preliminary wattage reading has been obtained in the aforementioned manner, the wattage output of the microwave oven 2 is determined by multiplying the preliminary wattage reading by the formula $T1/(T1-T2)$. As previously indicated, T1 designates the specific nominal radiation time input into the timer of the microwave oven 2, with T2 indicating the elapsed time from the pushing of the START button 9 of the microwave oven 2 to the illumination of the neon gas within the enclosures 44. As previously indicated, the illumination of the enclosures 44 in a strobe-like manner evidences the functionality of the antenna(s)/stirrer(s) of the microwave oven 2.

Though the output wattage of the microwave oven 2 could be measured by several existing techniques, such as measuring voltages and currents in its circuitry, or by measuring magnetic field strengths within the cooking chamber 4, the calorimetric technique employed by the wattmeter 10 has the advantage of not requiring interconnection to the circuitry of the microwave oven 2. Additionally, in the present wattmeter 10, the zeroing of the scale 40 made possible by its rotatable connection to the housing 20 eliminates the need to initially chill the wattmeter 10. In this respect, regardless of the actual temperature of the water infused into the interior chamber 24, the indicia 42 of the scale 40 is initially set to read zero relative to the indicator portion 34 of the thermometer 30 at the beginning of a measurement. As will be recognized, this zeroing procedure requires a minimal amount of time to accomplish, in contrast to the several minutes required to chill prior art measurement devices in a refrigerator and subsequently wait for them to return to a particular starting temperature.

The present wattmeter 10 also serves to eliminate the effect of the typical delayed starting of the microwave magnetron generator upon the pushing of the START button 9. As previously indicated, the effect of this delay is that after the START button 9 has been pushed (starting the timed interval), several seconds typically elapse before the production of microwaves by the microwave magnetron generator is initiated, with no microwaves being supplied to the cooking chamber 4 of the microwave oven 2 during such delay. The incorporation of the enclosures 44 into the wattmeter 10 aids in determining the amount of time delay T2 for a particular microwave oven, in that the neon gas within the enclosures 44 does not light up or illuminate until microwaves are present within the cooking chamber 4. As also previously indicated, the user simply counts the seconds which elapse after pressing the START button until the neon gas in the enclosures 44 is illuminated, and then uses this data to obtain a final wattage output measurement for the microwave oven 2. Because microwaves may not be uniformly distributed throughout the cooking chamber 4 of the microwave oven 2, the enclosures 44 are maintained in close proximity to the water and thermometer 30 by virtue of their attachment directly to the housing 20.

Additional modifications and improvements of the present invention may also be apparent to those ordinary skill in the art. Thus, the particular combination of parts described and illustrated herein is intended to represent only one embodiment of the present invention, and is not intended to serve as limitations of alternative devices within the spirit and scope of the invention.

What is claimed is:

1. A method for measuring the wattage output of a microwave oven having a cooking chamber, a timer into which a nominal radiation time may be set, a START button that activates the timer, and a microwave magnetron generator that supplies microwaves to the cooking chamber a number of seconds after the START button is pushed, using a calorimetric wattmeter having a housing defining an interior chamber, a thermometer attached to the housing and including a sensor portion which extends into the interior chamber and an indicator portion which moves in response to temperature changes sensed by the sensor portion, a scale which includes wattage indicia and is rotatably attached to the housing in a manner circumventing the indicator portion, and at least one neon gas filled enclosure attached to the housing, said method comprising the steps of:

(a) filling the interior chamber of the housing with a quantity of a microwave absorbing liquid;

(b) rotating the scale to set the wattage indicia thereon to zero relative to the position of the indicator portion;

(c) placing the wattmeter into the cooking chamber;

(d) setting a specific nominal radiation time T1 into the timer;

(e) pressing the START button;

(f) counting the number of seconds T2 that elapse between when the START button is pushed and when the neon gas in the enclosure illuminates;

(g) obtaining a preliminary wattage reading from the scale by correlating the position of the indicator portion to the wattage indicia on the scale; and (h) determining the wattage output of the microwave oven by multiplying the preliminary wattage reading by T1/(T1−T2).

2. The method of claim 1 wherein step (a) comprises infusing approximately six cubic inches of water into the interior chamber.

3. The method of claim 1 wherein step (d) comprises setting a specific nominal radiation time T1 of approximately ten seconds into the timer.

* * * * *